(12) United States Patent
Toriumi et al.

(10) Patent No.: US 9,306,026 B2
(45) Date of Patent: Apr. 5, 2016

(54) SEMICONDUCTOR STRUCTURE HAVING ALUMINUM OXYNITRIDE FILM ON GERMANIUM LAYER AND METHOD OF FABRICATING THE SAME

(71) Applicant: Japan Science and Technology Agency, Kawaguchi-shi, Saitama (JP)

(72) Inventors: Akira Toriumi, Tokyo (JP); Toshiyuki Tabata, Tokyo (JP)

(73) Assignee: Japan Science and Technology Agency, Kawaguchi-shi, Saitama (JP)

( * ) Notice: Subject to any disclaimer, the term of this patent is extended or adjusted under 35 U.S.C. 154(b) by 0 days.

(21) Appl. No.: 14/630,198

(22) Filed: Feb. 24, 2015

(65) Prior Publication Data
US 2015/0171185 A1   Jun. 18, 2015

Related U.S. Application Data

(63) Continuation of application No. PCT/JP2013/056678, filed on Mar. 11, 2013.

(30) Foreign Application Priority Data

Aug. 24, 2012   (JP) .................................. 2012-185276

(51) Int. Cl.
| | |
|---|---|
| *H01L 27/01* | (2006.01) |
| *H01L 29/51* | (2006.01) |
| *H01L 29/78* | (2006.01) |
| *H01L 21/02* | (2006.01) |
| *H01L 21/28* | (2006.01) |
| *H01L 29/16* | (2006.01) |
| *H01L 21/3105* | (2006.01) |

(52) U.S. Cl.
CPC ........ *H01L 29/517* (2013.01); *H01L 21/02337* (2013.01); *H01L 21/28255* (2013.01);

(Continued)

(58) Field of Classification Search
CPC .... H01L 27/01; H01L 27/12; H01L 27/10873
See application file for complete search history.

(56) References Cited

U.S. PATENT DOCUMENTS

| 6,069,094 A | 5/2000 | Matsumura et al. |
|---|---|---|
| 2002/0086557 A1 | 7/2002 | Matsumura et al. |

(Continued)

FOREIGN PATENT DOCUMENTS

| JP | H10-083988 A | 3/1998 |
|---|---|---|
| JP | 2006-210658 A | 8/2006 |

(Continued)

OTHER PUBLICATIONS

Jun Kishiwada et al., "Low Temperature Fabrication of AlN/Ge Structure Using Electron Cyclotron Resonance Plasma Nitridation", ECS Transactions, vol. 25, Issue 6, pp. 301-306 (2009), The Electrochemical Society.

(Continued)

*Primary Examiner* — Kyoung Lee
(74) *Attorney, Agent, or Firm* — Amster, Rothstein & Ebenstein, LLP

(57) ABSTRACT

A semiconductor structure includes: a germanium layer 30; and an aluminum oxynitride film 32 that is formed on the germanium layer, wherein: an EOT of the aluminum oxynitride film is 2 nm or less; Cit/Cacc is 0.4 or less; on a presumption that Au acting as a metal film is formed on the aluminum oxynitride film, the Cit is a capacitance value between the germanium layer and the metal film at a frequency of 1 MHz in a case where a voltage of the metal film with respect to the germanium layer is applied to an inversion region side by 0.5 V; and the Cacc is a capacitance value between the germanium layer and the metal film in an accumulation region.

10 Claims, 13 Drawing Sheets

(52) U.S. Cl.
CPC ............ *H01L21/3105* (2013.01); *H01L 29/16* (2013.01); *H01L 29/512* (2013.01); *H01L 29/513* (2013.01); *H01L 29/518* (2013.01); *H01L 29/78* (2013.01)

(56) References Cited

U.S. PATENT DOCUMENTS

| | | |
|---|---|---|
| 2006/0170017 A1 | 8/2006 | Muraoka |
| 2007/0042612 A1 | 2/2007 | Nishino et al. |
| 2009/0081845 A1* | 3/2009 | Yamazaki ......... H01L 21/76254 438/406 |

FOREIGN PATENT DOCUMENTS

| | | |
|---|---|---|
| JP | 2007-088422 A | 4/2007 |
| JP | 2011-054872 A | 3/2011 |

OTHER PUBLICATIONS

Masahiro Kudo et al., "Fabrication and Analysis of AlN/GaAs(001) and AlN/Ge/GaAs(001) Metal-Insulator-Semiconductor Structures", Japanese Journal of Applied Physics, vol. 51, pp. 02BF07-1-02BF07-5 (2012), The Japan Society of Applied Physics.

J. P. Xu et al., "Comparative Study of HfTa-based gate-dielectric Ge metal-oxide-semiconductor capacitors with and without AlON interlayer", Applied Physics A, vol. 99, Issue 1, pp. 177-180 (2010), Springer.

Tomonori Nishimura et al., "High-Electron-Mobility Ge n-Channel Metal-Oxide-Semiconductor Field-Effect Transistors with High-Pressure Oxidized Y2O3", Applied Physics Express [online], vol. 4, Issue 6, pp. 064201-1-064201-3 (Jun. 2, 2011).

Toshiyuki Tabata et al., "Effects of High Pressure Nitrogen Annealing on AlN/Ge MIS Gate Stacks", The 59th Spring Meeting, The Japan Society of Applied Physics, Lecture Proceedings, pp. 13-064 (2012).

Toshiyuki Tabata et al., "Effect of High Pressure Inert Gas Annealing on AlON/Ge Gate Stacks", Applied Physics Express, vol. 5, Issue 9, pp. 091002-1091002-3 (Aug. 22, 2012), The Japan Society of Applied PHysics.

Japan Patent Office, Notification of Reason(s) for Refusal, issued in PCT Patent Application No. PCT/JP2013/543456 mailed on Dec. 17, 2014, 2 pages.

* cited by examiner

○ 1 ATM, 500°C
△ 1 ATM, 600°C
● 50 ATM, 500°C
▲ 50 ATM, 600°C

SEMICONDUCTOR STRUCTURE HAVING ALUMINUM OXYNITRIDE FILM ON GERMANIUM LAYER AND METHOD OF FABRICATING THE SAME

CROSS REFERENCE TO RELATED APPLICATIONS

The present application is a Continuation of International Patent Application No. PCT/JP2013/056678, filed on Mar. 11, 2013, which claims priority to and the benefit of Japanese Patent Application No. 2012-185276, filed on Aug. 24, 2012, the entire contents of each of which are incorporated by reference herein.

TECHNICAL FIELD

The present invention relates to a semiconductor structure having an aluminum oxynitride film on a germanium layer and a method of fabricating the semiconductor structure.

BACKGROUND ART

Germanium (Ge) is a semiconductor that has better electrical properties than silicon (Si). However, germanium oxide (for example, $GeO_2$) is unstable. Therefore, the germanium oxide is rarely used for a semiconductor material forming a MOSFET (Metal Oxide Semiconductor Field Effect Transistor).

For example, non-patent documents 1 and 2 disclose that an aluminum nitride (AlN) film is used as a part of a gate insulating film. A dielectric constant of the aluminum nitride film is higher than that of silicon oxide ($SiO_2$) film. It is therefore possible to reduce an EOT (Equivalent Oxide Thickness) of the aluminum nitride film. When a miniaturization of a gate length is performed, reduction of the EOT is important.

PRIOR ART DOCUMENT

Non-Patent Document

Non-Patent Document 1: ECS Transactions, 25(6) (2009) pp 301-306

Non-Patent Document 2: Japanese Journal of Applied Physics 51 (2012) 02BF07

SUMMARY OF THE INVENTION

Problem to be Solved by the Invention

When the aluminum nitride film is formed and is then subjected to a thermal process that, an interface condition between the germanium layer and the aluminum nitride film is degraded. It is an object of the present invention to suppress degradation of an interface condition between a germanium layer and an aluminum oxynitride film.

Means for Solving the Problem

The present invention is directed to a semiconductor structure by including: a germanium layer; and an aluminum oxynitride film that is formed on the germanium layer, wherein: an EOT of the aluminum oxynitride film is 2 nm or less; $C_{it}/C_{acc}$ is 0.4 or less; when a metal film comprising gold is formed on the aluminum oxynitride film, the $C_{it}$ is a capacitance value between the germanium layer and the metal film at a frequency of 1 MHz when a voltage of the metal film with respect to the germanium layer is applied to an inversion region side by 0.5 V; and the $C_{acc}$ is a capacitance value between the germanium layer and the metal film in an accumulation region. In accordance with the present invention, it is possible to suppress degradation of an interface condition between a germanium layer and an aluminum oxynitride film.

In the above-mentioned structure, the $C_{it}/C_{acc}$ may be less than 0.05×T when an initial thickness (nm) of the aluminum oxynitride film before the thermal process is the T.

The above-mentioned structure may have at least one of a germanium oxynitride film and a compound film of a germanium oxynitride and an aluminum oxynitride, said at least one of the germanium oxynitride film and the compound film being formed between the germanium layer and the aluminum oxynitride film.

In the above-mentioned structure, the EOT of the aluminum oxynitride film may be 1 nm or less.

The above-mentioned structure may have a gate electrode that is formed on the aluminum oxynitride film.

The present invention is also directed to a method of fabricating a semiconductor structure including: a process of forming an aluminum oxynitride film on a germanium layer; a process of performing a thermal process to the aluminum oxynitride film in an inert gas atmosphere at a thermal process temperature in a pressure in which a pressure of the inert gas at a room temperature is higher than an atmospheric pressure, wherein the thermal process temperature is higher than a temperature during forming the aluminum oxynitride film. In accordance with the present invention, it is possible to suppress degradation of an interface condition between a germanium layer and an aluminum oxynitride film.

In the above-mentioned method, the inert gas may be a nitrogen gas.

In the above-mentioned method, the thermal process temperature of the process of performing the thermal process may be 400 degrees C. or more; and the pressure may be 2 atmospheres or more.

In the above-mentioned method, the thermal process temperature of the process of performing the thermal process may be 400 degrees C. or more; and the pressure may be 10 atmospheres or more.

The above-mentioned method may include a process of forming a gate electrode on the aluminum oxynitride film.

The above-mentioned method may include a process of forming a gate electrode on the aluminum oxynitride film, wherein: the inert gas may be a nitrogen gas; the thermal process temperature of the process of performing the thermal process may be 400 degrees C. or more; and the pressure may be 10 atmospheres or more.

Effects of the Invention

According to the present invention, it is possible to suppress degradation of an interface condition between a germanium layer and an aluminum oxytiride film.

MODES FOR CARRYING OUT THE EMBODIMENTS

It is studied that an aluminum oxynitride (AlON) film is used as a gate insulating film that is formed on a germanium substrate. When the aluminum oxynitride film is used, it is possible to reduce the EOT. However, when the aluminum oxynitride film is subjected to a thermal process in order to improve film quality of the aluminum oxynitride film, an interface condition between the germanium substrate and the aluminum oxynitride film is degraded. Accordingly, a condition that the interface condition between the germanium substrate and the aluminum oxynitride film is not degraded regardless of the thermal process is studied.

Figure 1A:
FIG. 1A, FIG. 1B, FIG. 1C, and FIG. 1D are cross-sectional views illustrating a method of fabricating a semiconductor structure.
Figure 1B:
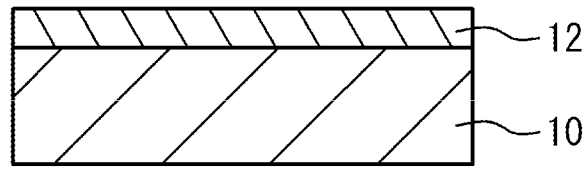

First, a description will be given of experiments performed by the present inventors. FIG. 1A to FIG. 1D illustrate a cross sectional view for describing a method of fabricating a semiconductor structure. As illustrated in FIG. 1A, a germanium substrate 10 is prepared. The germanium substrate 10 has a (100) face acting as a main face and is a p-type in which a dopant is Ga (gallium) and a dopant concentration is approximately $1 \times 10^{16}$ cm$^{-3}$. As illustrated in FIG. 1B, an aluminum oxynitride film 12 is formed on the germanium substrate 10. The aluminum oxynitride film 12 is formed by using aluminum nitride as a target and using a reactive sputtering method with use of gas including nitrogen gas. With aluminum nitride acting as the target, a composition ratio of nitrogen and aluminum is approximately 1:1. However, the aluminum nitride includes oxygen in an amount of a few atomic % to a few tens of atomic %. Therefore, the formed aluminum oxynitride film 12 has oxygen in an amount of a few atomic % to a few tens of atomic %.

Figure 1C:
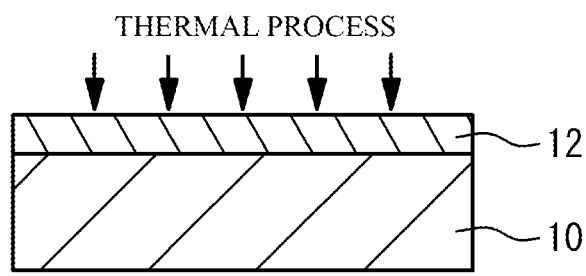
Figure 1D:
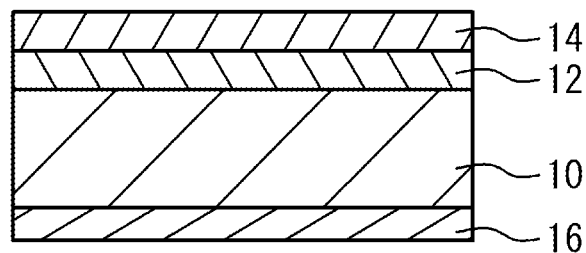

As illustrated in FIG. 1C, a thermal process of the germanium substrate 10 is performed in inert gas. The thermal process is a is conducted after forming the aluminum oxynitride film 12 and has an object to reduce a defect density of the aluminum oxynitride film 12. As illustrated in FIG. 1D, an aluminum (Al) film acting as a metal film 16 is formed on a back face of the germanium substrate 10, and a gold (Au) film acting as a metal film 14 is formed on a front face of the aluminum oxynitride film 12. It is possible to correct a voltage applied to the metal film 14 in a case where a material other than Au is used as the metal film 14 to a voltage in a case where Au is used as the metal film 14 with use of a work function of the metal film 14.

The aluminum oxynitride film 12 has a thickness of 3 nm. The thermal process of FIG. 1B was performed in nitrogen gas atmosphere for five minutes. Conditions of the thermal process of samples includes the following four conditions.

Gas pressure: 1 atmosphere, and thermal process temperature: 500 degrees C.

Gas pressure: 1 atmosphere, and thermal process temperature: 600 degrees C.

Gas pressure: 50 atmospheres, and thermal process temperature: 500 degrees C.

Gas pressure: 50 atmospheres, and thermal process temperature: 600 degrees C.

The gas pressures were pressures at a room temperature (approximately 25 degrees C.). That is, the samples were sealed with the above-mentioned pressure at a room temperature. After that, the temperature of the samples was increased, and the thermal processes were performed. Therefore, the gas pressures of the thermal processes were higher than the above-mentioned gas pressures. The same applies for the following experiments.

Figure 2A:
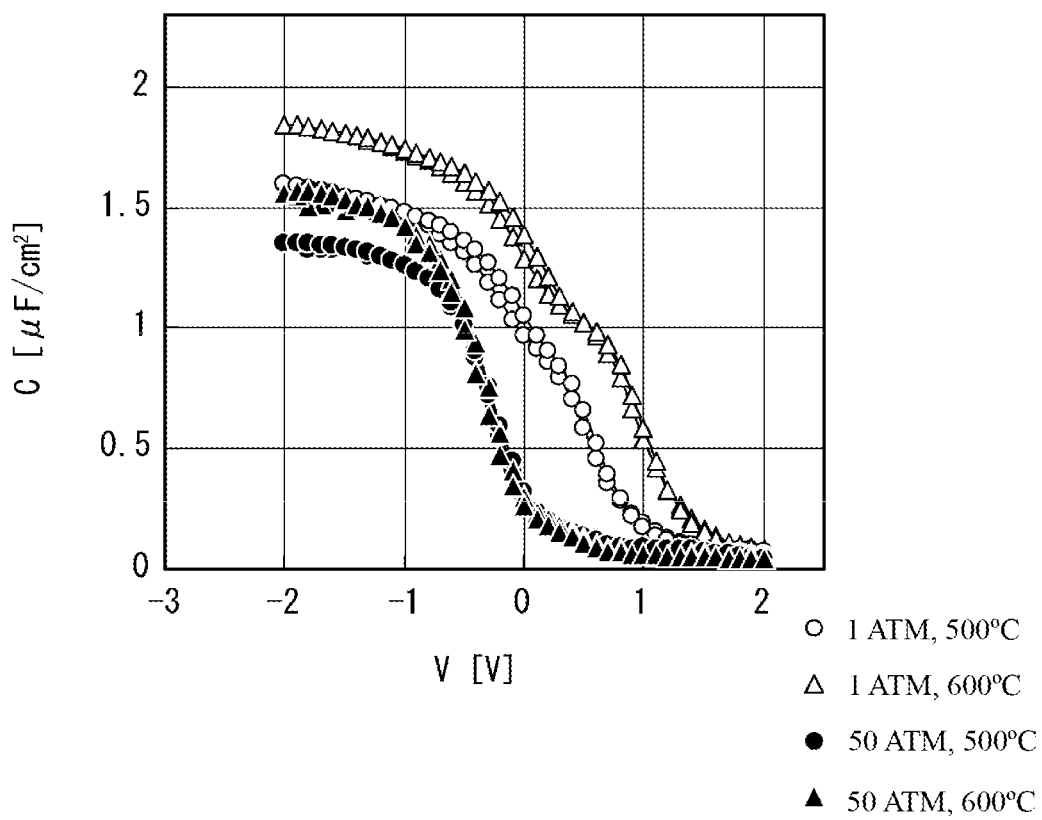
FIG. 2A and FIG. 2B respectively illustrate C-V characteristic and I-V characteristic of each sample.
Figure 2B:
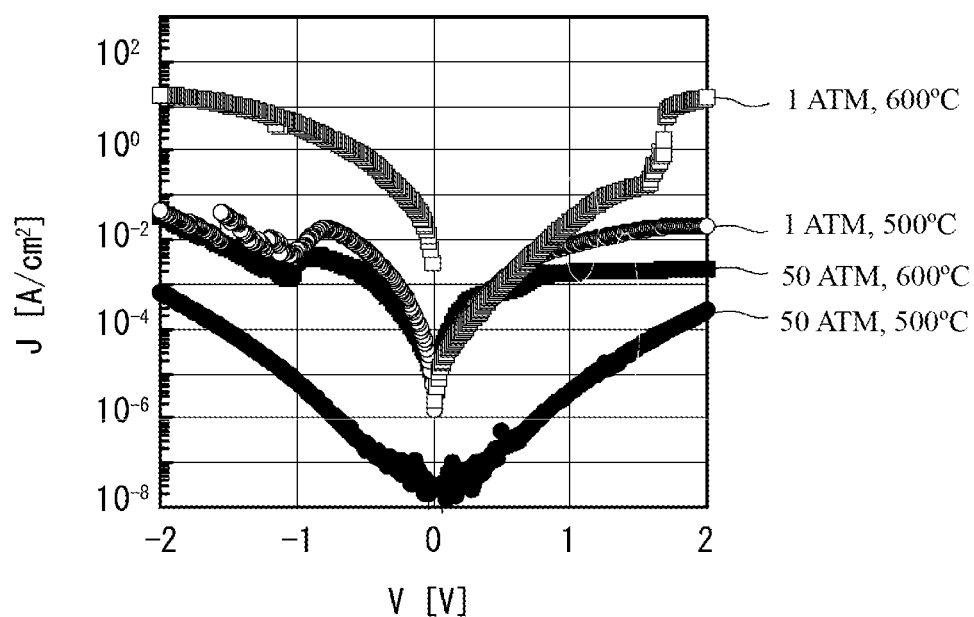

FIG. 2A and FIG. 2B respectively illustrate C-V characteristics and I-V characteristics of each sample. A temperature for measuring was a room temperature. In FIG. 2A and FIG. 2B, each dot indicates a measured point. FIG. 2A illustrates a capacitance value C between the metal film 16 and the metal film 14 with respect to voltage of the metal film 14 with respect to the metal film 16. A frequency for measuring the capacitance value was 1 MHz. As illustrated in FIG. 2A, regarding the samples of which gas pressure was 1 atmosphere, the capacitance value C decreases in steps in both of the thermal processes of 500 degrees C. and 600 degrees C. when the voltage V increases. Further, a hysteresis occurs in the C-V characteristic. On the other hand, regarding the samples of which gas pressure was 50 atmospheres, the C-V characteristic is preferable in both of the thermal processes of 500 degrees C. and 600 degrees C., and the hysteresis is small. As illustrated in FIG. 2A, a saturated capacitance value of the samples of 50 atmospheres and 500 degrees C. is 1.5 µF/cm$^2$ to 1.6 µF/cm$^2$. This corresponds to an EOT of 1.85 nm to 2 nm. In this manner, it is possible to convert the saturated capacitance value to the EOT.

FIG. 2B illustrates a leak current density J between the metal film 16 and the metal film 14 with respect to the voltage of the metal film 14 with respect to the metal film 16. As illustrated in FIG. 2B, regarding the samples of which gas pressure was 1 atmosphere, a leak current is large in both of the thermal processes of 500 degrees C. and 600 degrees C. On the other hand, regarding the samples of which gas pressure was 50 atmospheres, a leak current was small in both of the thermal processes of 500 degrees C. and 600 degrees C. As illustrated in FIG. 2A, a flat band voltage of these samples is approximately −0.5 V. As illustrated in FIG. 2B, leak current densities (flat band voltage is −1V) of the samples of which gas pressure was 1 atmosphere and of which temperatures were 500 degrees C. and 600 degrees C. are approximately $5 \times 10^{-2}$ A/cm$^2$ and $1 \times 10^{1}$ A/cm$^2$ respectively. Leak current densities (flat band voltage is −1V) of the samples of which gas pressure was 50 atmospheres and of which temperatures were 500 degrees C. and 600 degrees C. are approximately $1 \times 10^{-5}$ A/cm$^2$ and $1 \times 10^{-2}$ A/cm$^2$ respectively.

In this manner, FIG. 2A and FIG. 2B indicate that many interface states occur at an interface between the germanium substrate 10 and the aluminum oxynitride film 12 with respect to the samples of 1 atmosphere, and there are less interface states and a condition of the interface is preferable with respect to the samples of 50 atmospheres.

Figure 3A:
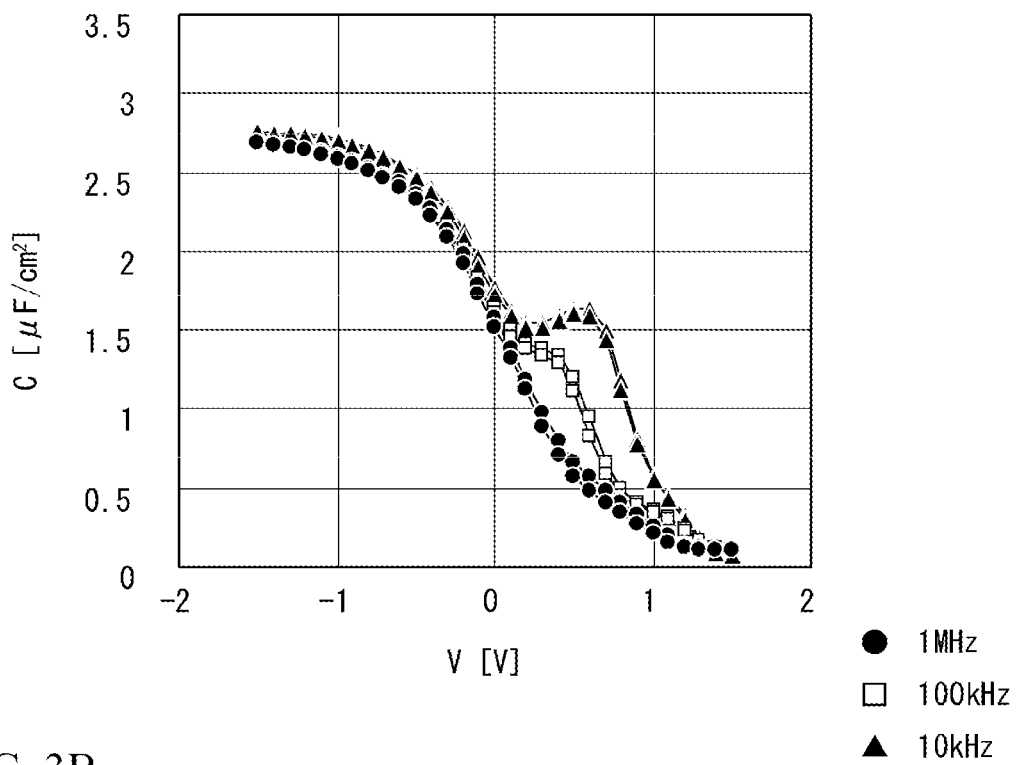
FIG. 3A and FIG. 3B illustrate C-V characteristic.
Figure 3B:
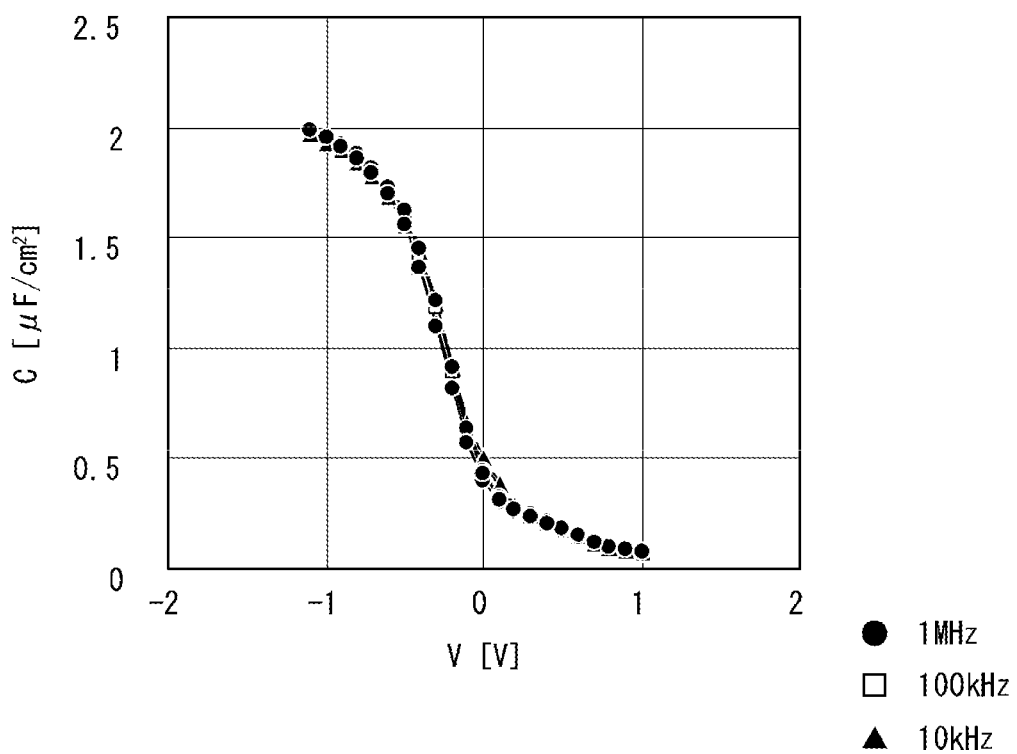

FIG. 3A and FIG. 3B illustrate C-V characteristics. FIG. 3A illustrates the C-V characteristic of the samples of which gas pressure was 1 atmosphere and of which temperature was 600 degrees C. FIG. 3B illustrates the C-V characteristics of the samples of which gas pressure was 50 atmospheres and of which temperature was 600 degrees C. The temperature for measuring was a room temperature. Frequencies were 10 kHz, 100 kHz and 1 MHz. In FIG. 3A, the capacitance value C near an inversion region at the frequency of 10 kHz is large. In FIG. 3B, the C-V characteristics are substantially the same regardless of the frequencies. This indicates that there are less interface states and the interface condition is preferable with respect to the sample of 50 atmospheres. Further, at the frequency of 1 MHz, the capacitance value of the samples of 50 atmospheres near the inversion region are also smaller than those of the samples of 1 atmosphere.

Figure 4:
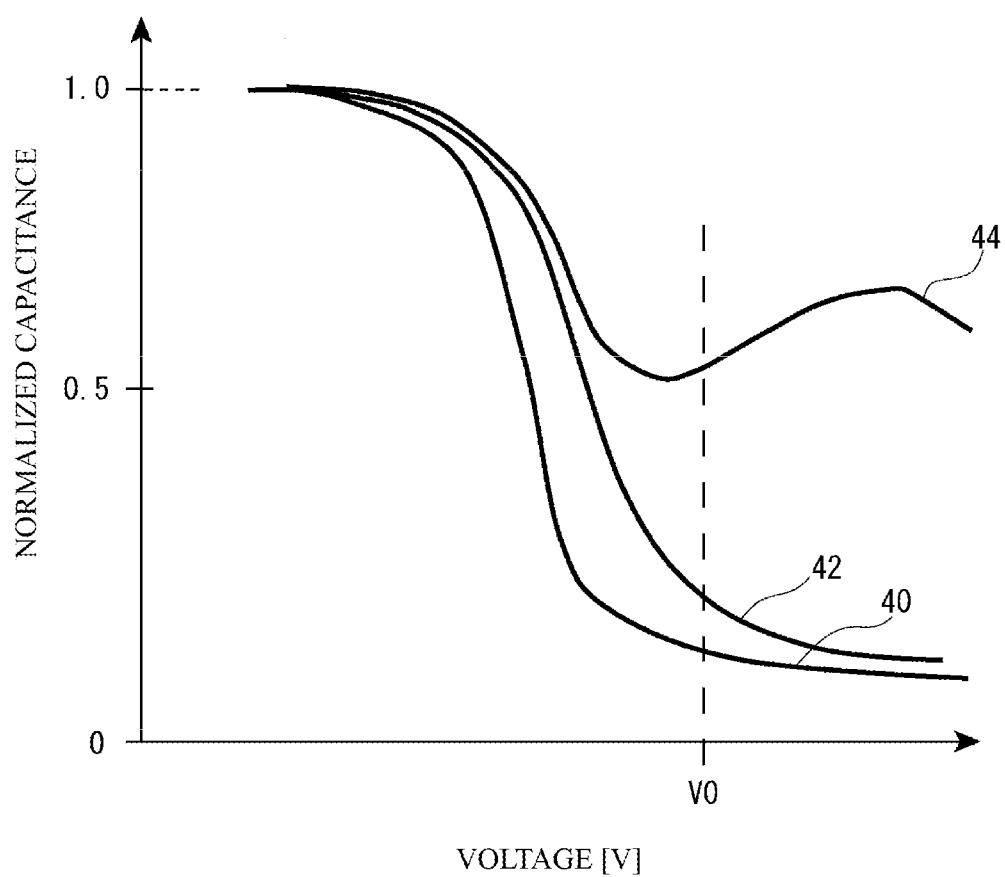
FIG. 4 illustrates a schematic view of capacitance values that are normalized with respect to a voltage V.

FIG. 4 illustrates a schematic view of a capacitance value that is normalized with a saturated capacitance value with respect to the voltage V. As illustrated in FIG. 4, the normalized capacitance value is a measured capacitance value at the frequency of 1 MHz that is normalized with a capacitance value of an accumulation region (a region of which voltage V is small). The order of the curves 40, 42 and 44 indicates the order of the degradation degree of the interface conditions under a condition that an identical germanium substrate was used and a temperature for measuring was a room temperature. The normalized capacitance value increases as the normalized values get closer to the curves 40, 42 and 44 near the inversion region. For example, it is possible to estimate a relative magnitude relation of the interface states density with the normalized capacitance value at the voltage of V0.

Figure 5A:
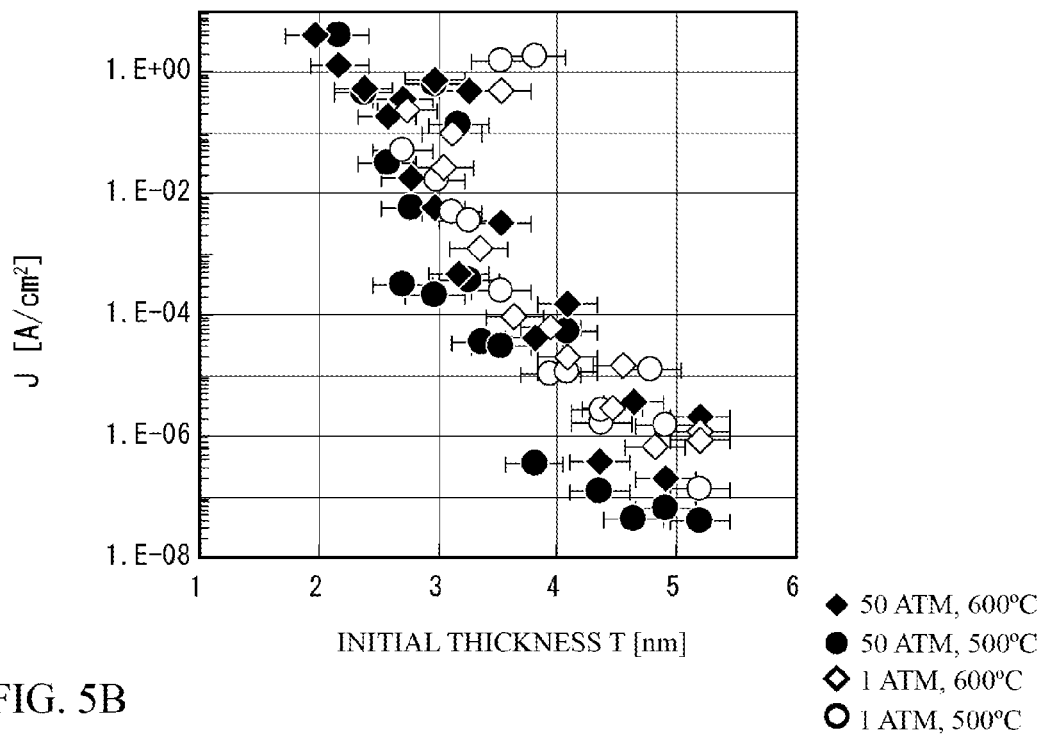
FIG. 5A and FIG. 5B respectively illustrate a leak current density and $C_{it}/C_{acc}$ with respect to an initial thickness.
Figure 5B:
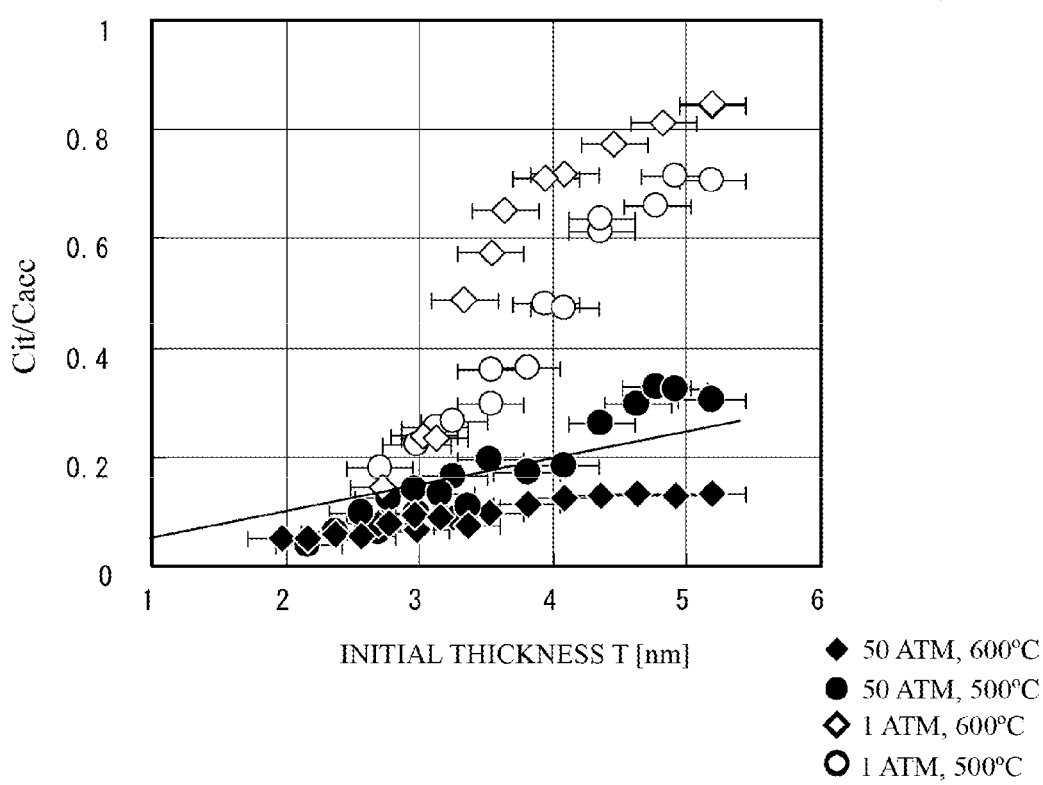

FIG. 5A and FIG. 5B respectively illustrate the leak current density J and $C_{it}/C_{acc}$ with respect to an initial thickness. A temperature for measuring was a room temperature. Each dot indicates a measured point. Each bar indicates an error. The Initial thickness T is a thicknesses of the aluminum oxynitride film 12 in a case where the aluminum oxynitride film 12 is formed on the germanium substrate 10. That is, the initial thickness T is a thickness of the aluminum oxynitride film 12 before the thermal process of FIG. 1C. The leak current density J is a leak current density in a case where the voltage V is the flat band voltage of −1V. The value $C_{it}/C_{acc}$ is a value in which a capacitance value Cit at the frequency of 1 MHz and the voltage V of 0.5V (corresponding to $V_0$ of FIG. 4) is normalized by a capacitance value $C_{acc}$ (corresponding to a saturated capacitance value) of the accumulation region.

As illustrated in FIG. 5A, the leak current density J of the samples of 50 atmospheres is slightly smaller than that of the samples of 1 atmosphere. As illustrated in FIG. 5B, the value $C_{it}/C_{acc}$ of the samples of 50 atmospheres is smaller than that of the samples of 1 atmosphere. This indicates that the samples of 50 atmospheres have a small interface state density and a preferable interface condition. As illustrated in FIG. 5B, regarding the samples of 50 atmospheres, the value Cit/Cacc can be 0.4 or less. A solid line of FIG. 5B indicates that the value $C_{it}/C_{acc}$ is 0.05×T. The samples of 50 atmospheres are the solid line or less. That is, the value $C_{it}/C_{acc}$ is smaller than 0.05×T.

As mentioned above, when the thermal process of the aluminum oxynitride film 12 is performed under the condition that the gas pressure is 50 atmospheres, it is possible to form a preferable interface between the germanium substrate 10 and the aluminum oxynitride film 12.

Next, the thermal process of FIG. 1B was performed under a condition that the thickness of the aluminum oxynitride film 12 was 3 nm, the thermal process temperature was 500 degrees C., the thermal process time was 5 minutes and the gas pressure was 50 atmospheres. Gas atmosphere of each sample was helium (He) gas, argon (Ar) gas and nitrogen ($N_2$) gas.

Figure 6A:
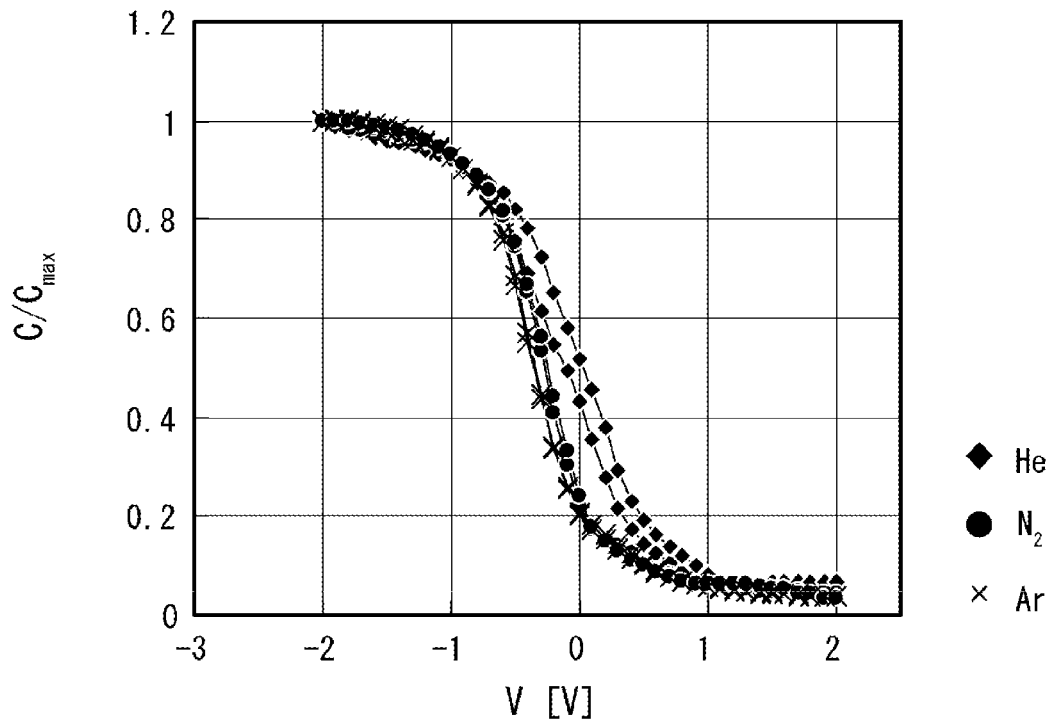
FIG. 6A and FIG. 6B respectively illustrate C-V characteristic and I-V characteristic of each sample.
Figure 6B:
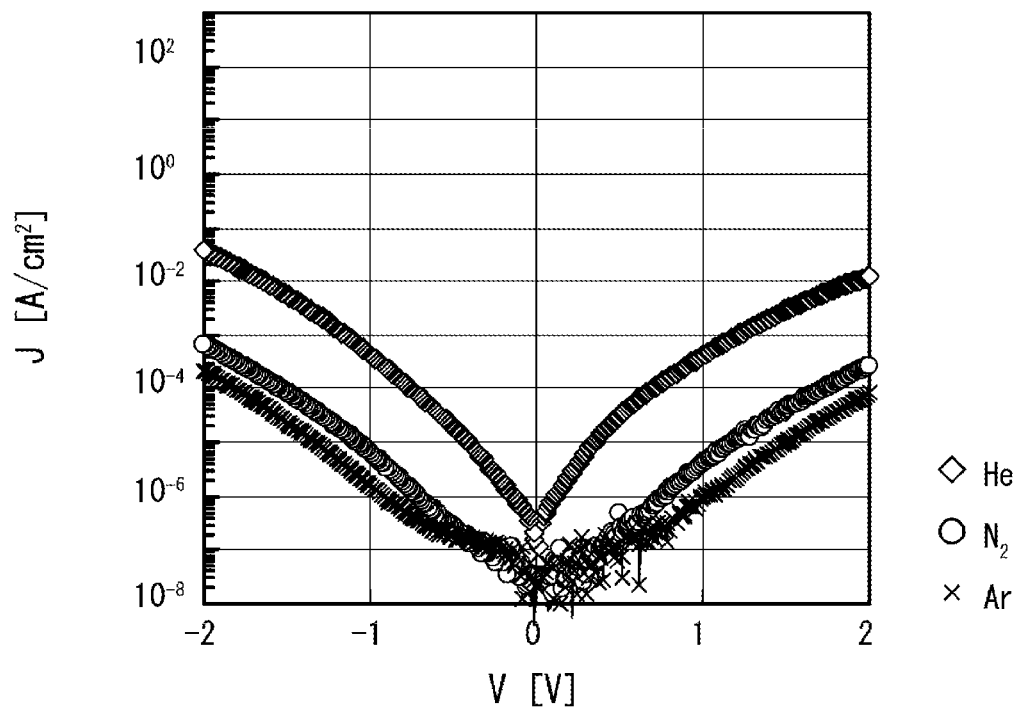

FIG. 6A and FIG. 6B respectively illustrate C-V characteristics and I-V characteristics of each sample. A temperature for measuring was a room temperature. In FIG. 6A and FIG. 6B, each dot indicates a measured point, and a straight line indicates a line connecting the dots. A measuring method is the same as FIG. 2A and FIG. 2B. As illustrated in FIG. 6A, when the helium gas and the argon gas were used as the thermal process gas, the steps and the hysteresis of the C-V characteristic are smaller than those of the samples of the gas pressure of 1 atmosphere and the thermal process temperature of 500 degrees C. of FIG. 2A. As illustrated in FIG. 6A, the leak current are smaller than that of the samples of the gas pressure of 1 atmosphere and the thermal process temperature of 500 degrees C. As illustrated in FIG. 6A, the flat band voltage of these samples is approximately −0.5V. As illustrated in FIG. 6B, when the helium gas, the nitrogen gas and the argon gas were used as the thermal process gas, the leak currents at the flat band voltage of −1V are approximately $5\times10^{-3}$ A/cm$^2$, approximately $1\times10^{-4}$ A/cm$^2$ and approximately $1\times10^{-5}$ A/cm$^2$ respectively. In this manner, it is possible to form a preferable interface between the germanium substrate 10 and the aluminum oxynitride film 12 when the helium gas and the argon gas were used. In particular, the case in which the argon gas is used, the level is the same as that of the nitrogen gas.

As mentioned above, it is understood that the atmosphere of the thermal process may be other than the nitrogen gas and may be noble gas.

Next, the thermal process of FIG. 1B was performed under a condition that the thermal process temperature was 500 degrees C., the thermal process time was 5 minutes, the atmosphere was nitrogen gas, and the gas pressure was 50 atmospheres. The thicknesses of the aluminum oxynitride film 12 of the samples were 24 nm and 3 nm.

Figure 7:
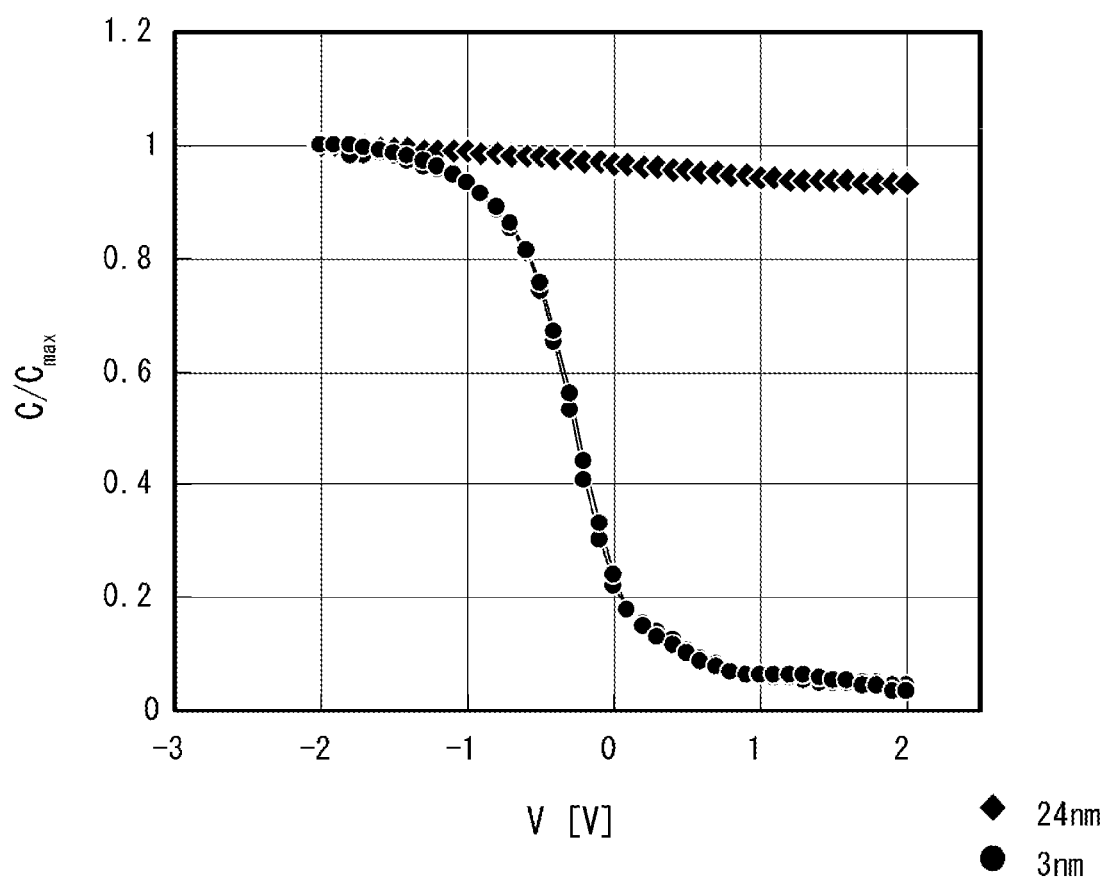
FIG. 7 illustrates C-V characteristic of each sample.

FIG. 7 illustrates C-V characteristics of each sample. In FIG. 7, the capacitance value C is normalized by a maximum capacitance value $C_{max}$. Other measuring methods are the same as described above with respect to FIG. 2A. As illustrated in FIG. 7, when the thickness of the aluminum oxynitride film 12 is 24 nm, an inversion layer is not formed. In this manner, it is preferable that the thickness of the aluminum oxynitride film 12 is small.

Next, the thermal process of FIG. 1B was performed under a condition that the thermal process temperature was 600 degrees C., the thermal process time was 5 minutes, the atmosphere was nitrogen atmosphere, and the gas pressure was 50 atmospheres. The thicknesses of the aluminum oxynitride film 12 of each of the samples was 5 nm and 3 nm.

Figure 8:
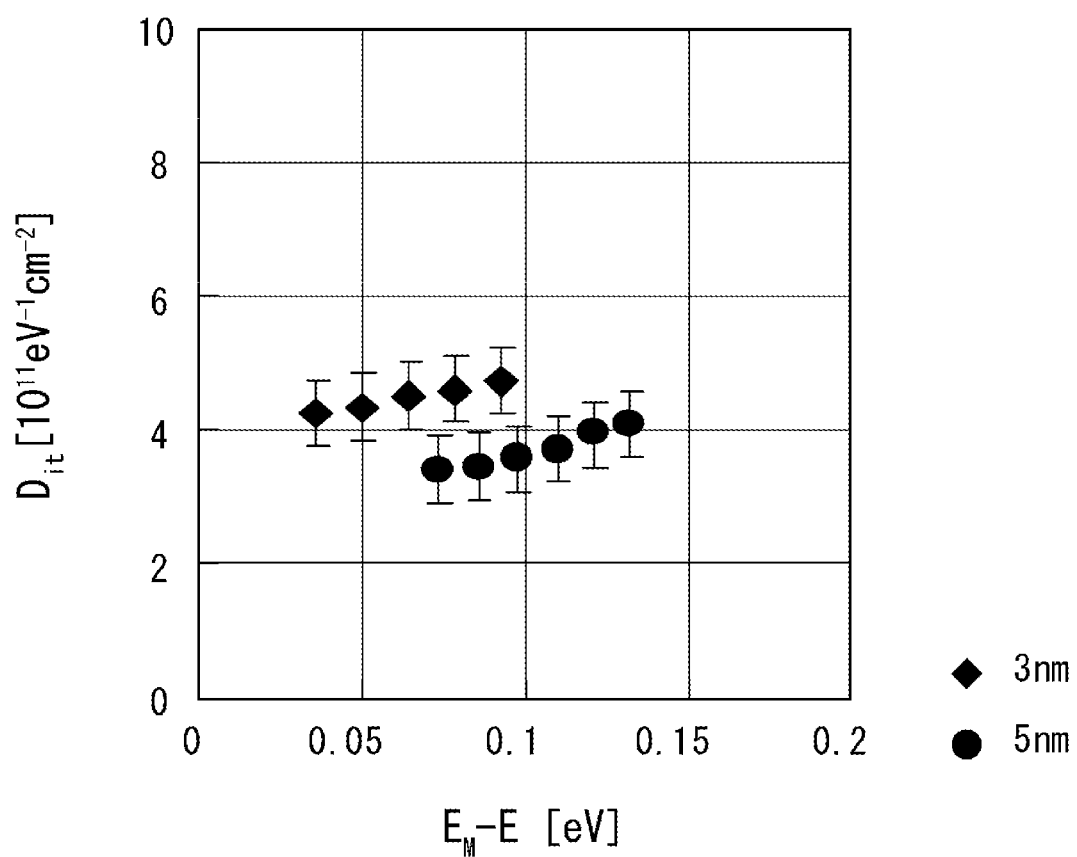
FIG. 8 illustrates an interface state density $D_{it}$.

FIG. 8 illustrates an interface state density $D_{it}$. In FIG. 8, a vertical axis indicates the interface state density $D_{it}$. A horizontal axis indicates energy from a center EM of energy gap. The value $D_{it}$ was calculated by a C-V measurement at 200 K. Each dot indicates a measured point. Bars of an upper side and a lower side indicate a measurement error. As illustrated in FIG. 8, when the thicknesses of the aluminum oxynitride film 12 were 5 nm and 3 nm, the interface state density is as small as $4\times10^{11}$ eV$^{-1}$cm$^{-2}$. And so, factors for suppressing the interface state density was searched by a thermal process with a high pressure in an inert gas atmosphere.

Figure 9A:
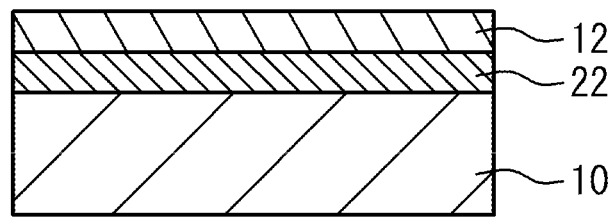
FIG. 9A to FIG. 9C respectively illustrate a cross sectional view of samples A to C.
Figure 9B:
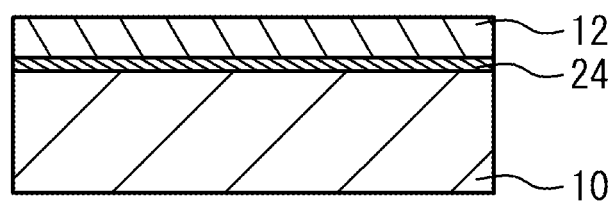
Figure 9C:
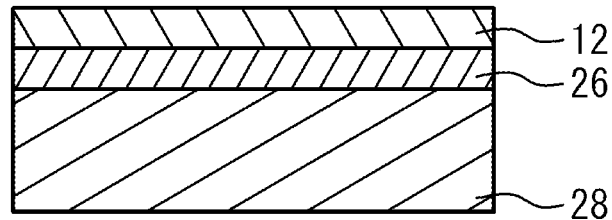

FIG. 9A to FIG. 9C respectively illustrate a cross sectional view of samples A to C. As illustrated in FIG. 9A, regarding the sample A, a germanium oxynitride film 22 having a thickness of 10 nm is formed on the germanium substrate 10 by a sputtering method. The aluminum oxynitride film 12 having a thickness of 3 nm is formed on the germanium oxynitride film 22 by the same method as described above with respect to FIG. 1B.

As illustrated in FIG. 9B, regarding the sample B, the aluminum oxynitride film 12 having a thickness of 3 nm is formed on the germanium substrate 10 by the same method as described above with respect to FIG. 1B. When the aluminum oxynitride film 12 is formed, a thin germanium oxynitride film 24 is formed on the germanium substrate 10 by the nitrogen gas, residual oxygen and so on that are used in the sputtering method.

As illustrated in FIG. 9C, regarding the sample C, a silicon oxide film 26 having a thickness of 10 nm is formed on a silicon substrate 28 by a thermal oxidation method. The aluminum oxynitride film 12 having a thickness of 3 nm is formed on the silicon oxide film 26 by the same method as FIG. 1B.

Figure 10A:
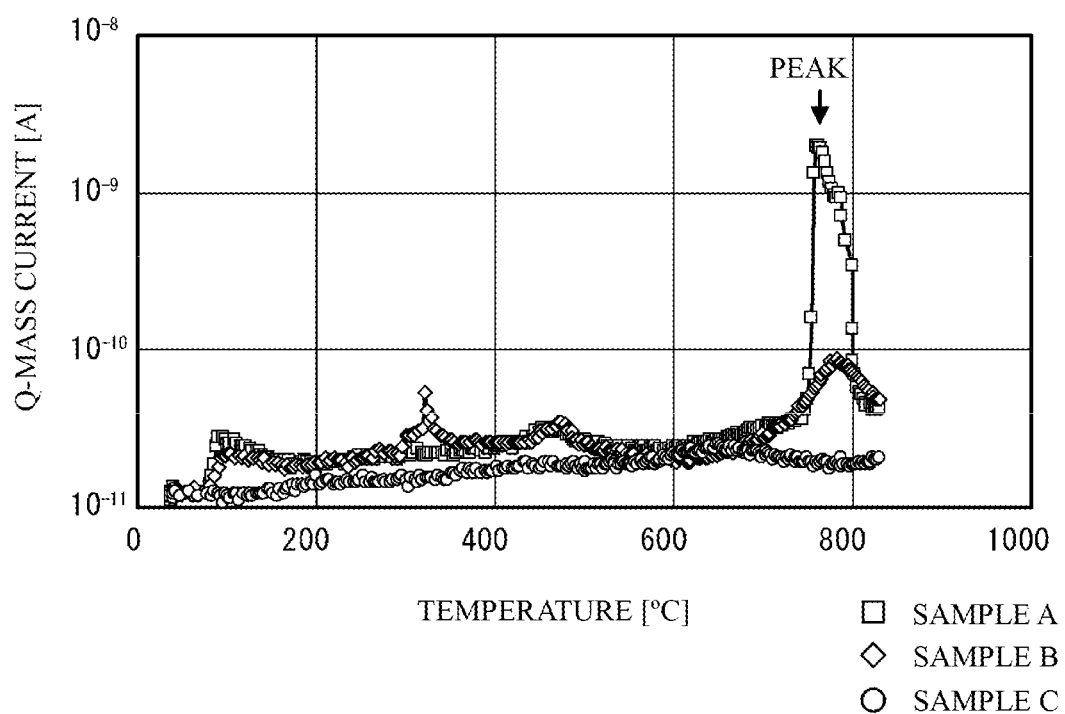
FIG. 10A illustrates a Q-Mass current of nitrogen gas with respect to a thermal process temperature of each sample.
Figure 10B:
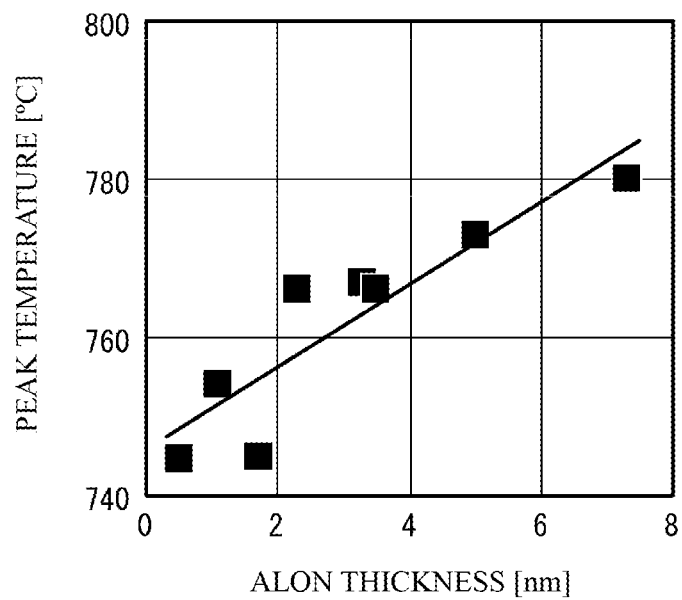
FIG. 10B illustrates results in which gas exhausted from each sample was measured with use of a Q-Mass in case where a thermal process of each sample was performed in vacuum atmosphere.

FIG. 10A illustrates a Q-Mass current of the nitrogen gas with respect to the thermal process temperature of each sample. FIG. 10B illustrates results in which gas exhausted from each sample was measured with use of the Q-Mass in a case where the thermal process of each sample was performed in vacuum atmosphere. A vertical axis indicates the Q-Mass current of the nitrogen gas. A horizontal axis indicates the thermal process temperature. Each dot indicates a measured point. A straight line indicates a line connecting the dots. As illustrated in FIG. 10A, regarding the sample C, the nitrogen gas is not exhausted at 800 degrees C. or more. Regarding the sample B, the nitrogen gas is exhausted at approximately 780 degrees C. The amount of the exhausted nitrogen gas of the sample A is larger than that of the sample B at approximately 770 degrees C.

FIG. 10B illustrates a peak temperature with respect to the thickness of the aluminum oxynitride film. In FIG. 10B, the thickness of the aluminum oxynitride of the sample A is changed, and the peak temperatures at which the nitrogen gas is exhausted are plotted. Each dot indicates a measured point. A straight line indicates an approximation line. When the thickness of the aluminum oxynitride film 12 increases, the peak temperature is slightly shifted to a high temperature side.

Based on the above-mentioned results, the present inventors estimated the factor that the interface characteristic between the germanium substrate 10 and the aluminum oxynitride film 12 is degraded by the thermal process of the aluminum oxynitride film 12 on the germanium substrate 10 at 1 atmosphere, as follows.

As illustrated in FIG. 9B, when the aluminum oxynitride film 12 is formed on the germanium substrate 10, the germanium oxynitride film 24 is formed between the germanium substrate 10 and the aluminum oxynitride film 12. Thus, the interface characteristic between the germanium substrate 10 and the aluminum oxynitride film 12 is preferable.

As illustrated in FIG. 10A, the nitrogen gas is exhausted when the thermal process of the sample B is performed. The nitrogen gas is not exhausted from the sample C. Much of the nitrogen gas is exhausted from the sample A. Therefore, it is understood that the nitrogen is not exhausted from the aluminum oxynitride film 12, and the nitrogen gas is exhausted from the germanium oxynitride film 24 via the aluminum oxynitride film 12. That is, the nitrogen gas exhausted from the sample B is the nitrogen of the germanium oxynitride film 24.

As illustrated in FIG. 2A and FIG. 2B, when the thermal process is performed in the nitrogen gas atmosphere with high pressure, removal of the germanium oxynitride film 24 is suppressed and the interface characteristic is preferable. On the other hand, when the thermal process is performed in the nitrogen atmosphere with low pressure, it is thought that the germanium oxynitride film 24 is removed or the thickness of the germanium oxynitride film 24 is reduced and the interface characteristic is degraded.

As illustrated in FIG. 6A and FIG. 6B, the degradation of the interface characteristic is suppressed in the thermal process in the noble gas atmosphere with high pressure. Thus, at least, the atmosphere of the thermal process may be inert gas if not nitrogen gas. It is thought that this is because the exhaust of the nitrogen is suppressed by a total pressure of the atmosphere during the thermal process. Therefore, at least, the atmosphere of the thermal process may be gas that does not react with the aluminum oxynitride film 12 or the germanium substrate 10.

The germanium oxynitride film 24 and the aluminum oxynitride sometimes diffuse with each other. Therefore, at least one of the germanium oxynitride film and a compound film of the germanium oxynitride and the aluminum oxynitride is formed between the germanium substrate 10 and the aluminum oxynitride film 12. It is preferable that the above-mentioned thickness is 1 nm or less, it is more preferable that the thickness is 0.5 nm or less, and it is much more preferable that the thickness is 0.3 nm in view of thickness reduction of the EOT. It is preferable that the above-mentioned thickness is 0.1 nm or more in order to maintain the preferable interface condition between the germanium substrate 10 and the aluminum oxynitride film 12.

In the following, a description will be given of an embodiment of the present invention based on the above-mentioned experiment results.

Embodiment 1

Figure 11A:
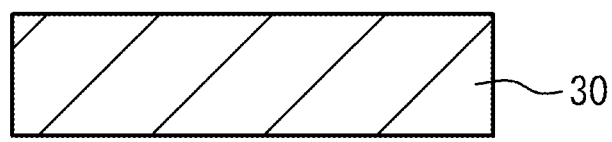
FIG. 11A, FIG. 11B, and FIG. 11C illustrate a cross sectional view of a fabricating method of a semiconductor structure of an embodiment 1.
Figure 11B:
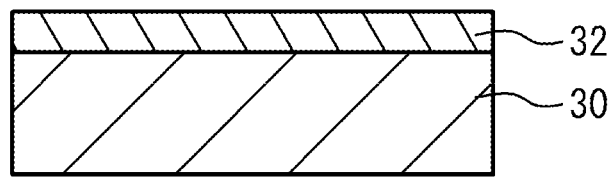
Figure 11C:
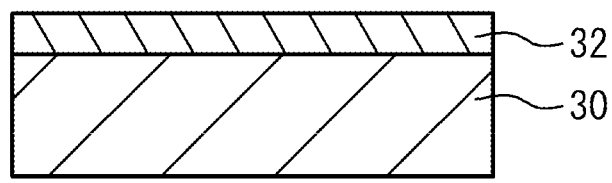

FIG. 11A to FIG. 11C illustrate a cross sectional view of the method of fabricating the semiconductor structure in accordance with an embodiment 1. As illustrated in FIG. 11A, a germanium layer 30 is prepared. The germanium layer 30 may be a single crystal germanium substrate or a germanium film formed on a substrate (for example, a silicon substrate). And, the germanium layer 30 may be highly-pure germanium or may include impurities. For example, the germanium layer 30 may be n-type or p-type germanium. Further, the germanium layer 30 may include silicon in an amount which achieves the effect of the above-mentioned experiments. At least, the composition ratio of the silicon is 10 atomic % or less of the whole. The main face of the germanium layer 30 may be a (111) face or the like. However, the main face may be another face such as a (110) face or a (100) face.

As illustrated in FIG. 11B, an aluminum oxynitride film 32 is formed on the germanium layer 30. The aluminum oxynitride film 32 is formed by a sputtering method or the like. Aluminum nitride or aluminum may be used as the target. When the nitrogen gas is included as the sputtering gas, it is possible to form the aluminum oxynitride film 32 with use of the reactive sputtering method. It is not necessary for the aluminum oxynitride film 32 to include oxygen. However, the aluminum is easily oxidized. Therefore, the aluminum nitride film includes oxygen and acts as the aluminum oxynitride film 32. A content of oxygen in the aluminum oxynitride film 32 is a few atomic % to a few tens of atomic %. Further, the oxygen content may be a few atomic % or less.

As illustrated in FIG. 11C, the germanium layer 30 and the aluminum oxynitride film 32 are subjected to a thermal process under high pressure in an inert gas atmosphere. Thus, the film quality of the aluminum oxynitride film 32 can be improved. Further, degradation of interface characteristic between the germanium layer 30 and the aluminum oxynitride film 32 can be suppressed. The thermal process is performed at a thermal process temperature that is higher than a temperature during forming the aluminum oxynitride film 32. For example, the thermal process temperature of 400 degrees C. or more is preferable as a temperature for improving the film quality of the aluminum oxynitride film 32. More preferably, the thermal process temperature is 500 degrees C. or more. It is preferable that the thermal process temperature is 700 degrees C. or less in order to suppress thermal stress or the like. The inert gas is gas that does not react with the aluminum oxynitride film 32 or the germanium layer 30 at the thermal process temperature, and is nitrogen gas, eighteenth group element gas such as helium, neon (Ne), argon, krypton (Kr), Xenon (Xe) or Radon (Rn) and so on or mixed gas of them. The gas pressure of the thermal process is a pressure achieving that the pressure of the inert gas at a room temperature is higher than air atmosphere and is determined in accordance with the thickness of the aluminum oxynitride film 32 and the thermal process temperature and the like. In order to suppress the degradation of the interface characteristic between the germanium layer 30 and the aluminum oxynitride film 32, it is preferable that the gas pressure at a room temperature is 2 atmospheres or more for example. It is preferable that the gas pressure is 5 atmospheres or more, 10 atmospheres or more, or 20 atmosphere or more. It is preferable that the gas pressure at a room temperature is 100 atmospheres or less.

When a thickness of an insulating layer is reduced, a leak current increases. However, regarding the semiconductor structure fabricated by the fabricating method of the embodiment 1, it is possible to reduce the leak current to $1\times10^{-2}$ A/cm$^3$ or less in a case where the EOT of the aluminum oxynitride film 32 is 2 nm or less and a voltage with respect to the germanium layer 30 of a metal film (with reference to the metal film 14 of FIG. 1D) on a presumption that the metal layer is formed on the aluminum oxynitride film 32 is a flat band voltage of −1V. As illustrated in FIG. 5B, the value $C_{it}/C_{acc}$ can be 0.4 or less when a capacitance value between the germanium layer 30 and the metal layer is expressed as Cit in a case where the voltage of the metal layer with respect to the germanium layer 30 is 0.5 V, and a capacitance value between the germanium layer 30 and the metal film in the accumulation region is expressed as $C_{acc}$. Further, it is preferable that the Cit/Cacc can be 0.3 or less. It is more preferable that the $C_{it}/C_{acc}$ can be 0.2 or less. It is much more preferable that the $C_{it}/C_{acc}$ can be 0.15 or less. In this manner, it is possible to reduce the interface state density. Further, when the initial thickness (nm) of the aluminum oxynitride film 32 is T, the $C_{it}/C_{acc}$ can be less than 0.05×T. Preferably, the $C_{it}/C_{acc}$ can be less than 0.04×T. It is preferable that the EOT of the aluminum oxynitride film 32 can be 1.5 nm or less. It is more preferable that the EOT can be 1.0 nm or less. It is preferable that the leak current density can be $1\times10^{-3}$ A/cm$^3$ or less. It is more preferable that the leak current density can be $1\times10^{-4}$ A/cm$^3$ or less.

In FIG. 5B, the capacitance value in a case where the voltage of the metal film with respect to the germanium layer 30 is 0.5 V is the $C_{it}$ because a p-type germanium substrate is used. However, when an n-type germanium layer is used, the capacitance value in a case where the voltage of the metal film with respect to the germanium layer 30 is −0.5 V is the $C_{it}$. That is, the $C_{it}$ is the capacitance value in a case where the voltage of 0.5 V of the metal film with respect to the germanium layer 30 is applied to the inverse region side. And, the case where the voltage of the metal film with respect to the germanium layer 30 is −1V from the flat band voltage corresponds to the case where 1V is applied to the accumulation region side from the flat band voltage.

Further, when the C-V characteristics are measured at a room temperature at a frequency of 1 MHz, a voltage difference at $C=C_{max}/2$ ($C_{max}$ is a maximum capacitance value) is an index of hysteresis. Regarding the semiconductor structure fabricated by the fabricating method of the embodiment 1, the index of the hysteresis can be 50 mV or less when the EOT is 2 nm or less. The index of the hysteresis can be 30 mV or less. In this manner, the interface condition between the germanium layer 30 and the aluminum oxynitride film 32 can be improved.

In FIG. 11A, a germanium substrate was used as the germanium layer 30. In FIG. 11B, the aluminum oxynitride film 32 having a thickness of 2 nm was formed by a sputtering method using nitrogen gas with use of aluminum nitride as a target. In FIG. 11C, a thermal process was performed in nitrogen gas atmosphere under a condition that the thermal process temperature was 600 degrees C., the thermal process time was 5 minutes, and a pressure at a room temperature was 50 atmospheres. The C-V characteristics and the I-V characteristics of samples made in this manner were measured. The EOT of the samples is approximately 0.9 nm.

Figure 12A:
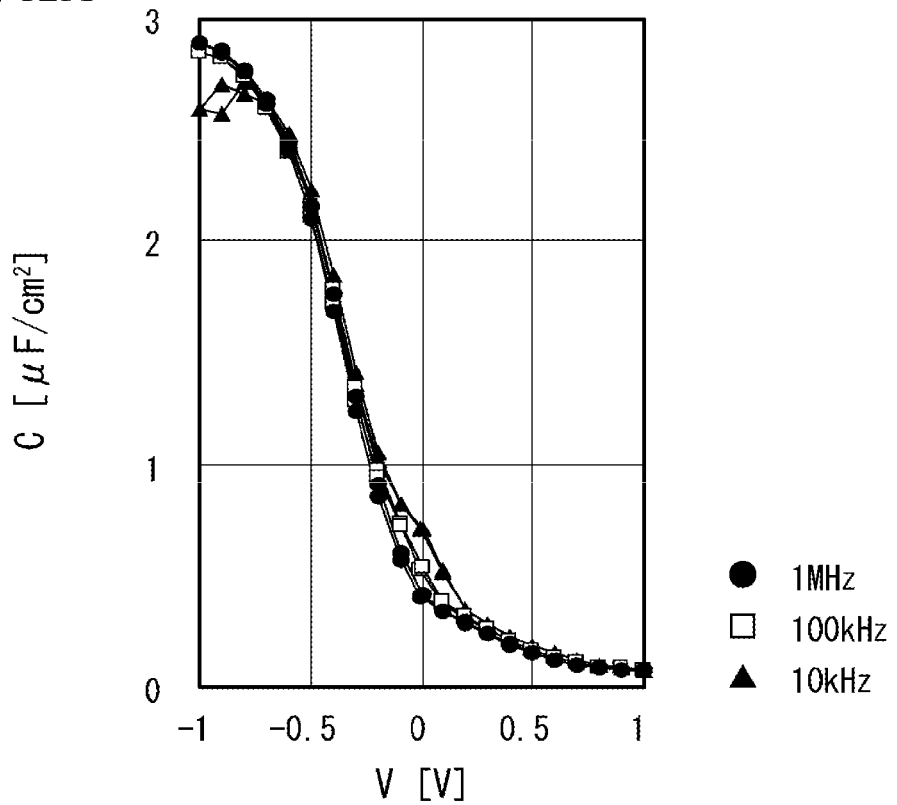
FIG. 12A illustrates C-V characteristics.
Figure 12B:
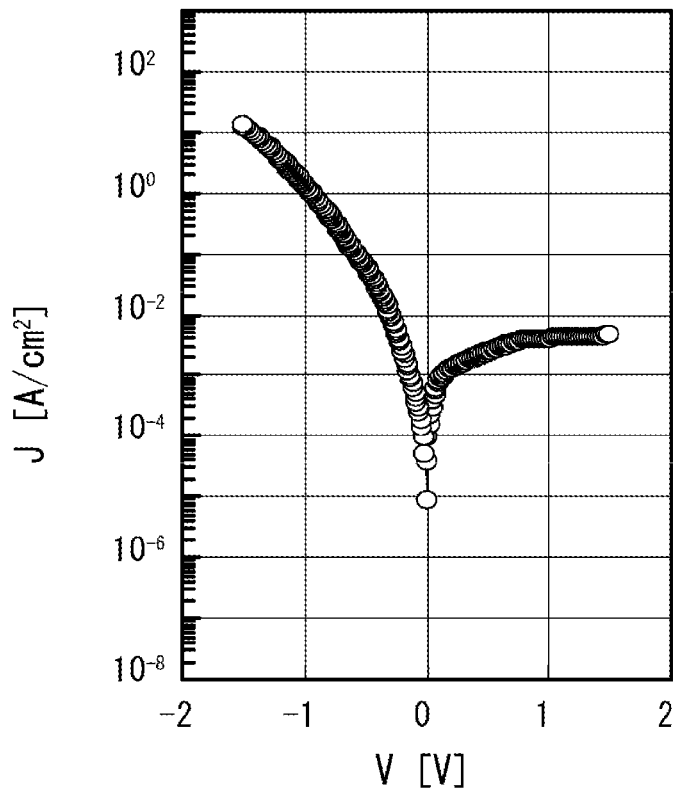
FIG. 12B illustrates I-V characteristics.

FIG. 12A illustrates the C-V characteristics. FIG. 12B illustrates the I-V characteristics. As illustrated in FIG. 12A, frequencies of the C-V measurement are 1 MHz, 100 kHz and 10 kHz. The C-V characteristics is preferable. As illustrated in FIG. 12B, a leak current of a forward direction is $1\times10$ A/cm$^2$ or less. A leak current of a backward direction is $1\times10^{-2}$ A/cm$^2$. In this manner, even if the EOT is 1 nm or less, the leak current (particularly the backward direction) is a small value of $1\times10^{-2}$ A/cm$^2$.

Figure 13:
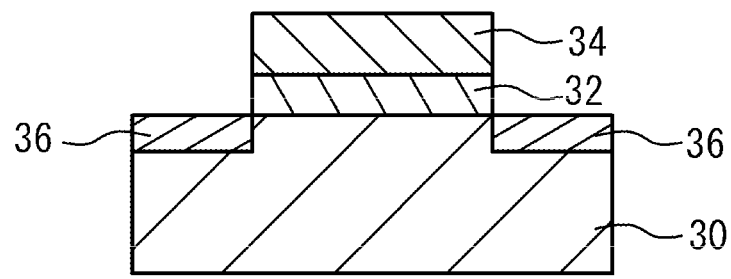
FIG. 13 illustrates a cross sectional view of a transistor using a semiconductor structure of an embodiment of the present invention.

FIG. 13 illustrates a cross sectional view of a transistor using the semiconductor structure of the embodiment 1. A gate electrode 34 is formed on the aluminum oxynitride film 32 above the germanium layer 30. A source or drain region 36 is formed in the germanium layer 30 on both sides of the gate electrode 34. The germanium layer 30 is a p-type. The source or drain region 36 is an n-type. The germanium layer 30 may be an n-type. The source or drain region 36 may be a p-type. As in the case of the transistor of FIG. 13, when the aluminum oxynitride film 32 is used as a gate insulating film, a MOSFET in which an EOT of the gate insulating film is small and an interface condition between the gate insulating film and a semiconductor layer is preferable can be achieved.

The semiconductor structure of the embodiment 1 can be applied to another semiconductor device other than the MOSFET.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10 germanium substrate
12, 32 aluminum oxynitride film
24 germanium oxynitride film
30 germanium layer
34 gate electrode

The invention claimed is:

1. A semiconductor structure comprising:
a germanium layer; and
an aluminum oxynitride film that is formed on the germanium layer,
wherein an EOT of the aluminum oxynitride film is 2 nm or less,
wherein at an interface between the germanium layer and the aluminum oxynitride film:
Cit/Cacc is 0.4 or less;
wherein if a metal film comprising gold is formed on the aluminum oxynitride film, the Cit is a capacitance value between the germanium layer and the metal film at a frequency of 1 MHz in a case where a voltage of the metal film with respect to the germanium layer is applied to an inversion region side by 0.5 V and the Cacc is a capacitance value between the germanium layer and the metal film in an accumulation region;
the Cit/Cacc is less than 0.05×T when an initial thickness (nm) of the aluminum oxynitride film before the thermal process is the T.

2. The semiconductor structure of claim 1, further comprising at least one of a germanium oxynitride film and a compound film of a germanium oxynitride and an aluminum oxynitride, said at least one of the germanium oxynitride film and the compound film being formed between the germanium layer and the aluminum oxynitride film.

3. The semiconductor structure of claim 1, wherein the EOT of the aluminum oxynitride film is 1 nm or less.

4. The semiconductor structure of claim 1, further comprising a gate electrode that is formed on the aluminum oxynitride film.

5. A method of fabricating a semiconductor structure comprising:
a process of forming an aluminum oxynitride film on a germanium layer;
a process of performing a thermal process to the aluminum oxynitride film in an inert gas atmosphere at a thermal process temperature in a pressure in which a pressure of the inert gas at a room temperature is higher than an atmospheric pressure,
wherein the thermal process temperature is higher than a temperature during forming the aluminum oxynitride film.

6. The method of claim 5, wherein the inert gas is a nitrogen gas.

7. The method of claim 5, wherein:
the thermal process temperature of the process of performing the thermal process is 400 degrees C. or more; and
the pressure is 2 atmospheres or more.

8. The method of claim 5, wherein:
the thermal process temperature of the process of performing the thermal process is 400 degrees C. or more; and
the pressure is 10 atmospheres or more.

9. The method of claim 5, further comprising a process of forming a gate electrode on the aluminum oxynitride film.

10. The method of claim 5, further comprising a process of forming a gate electrode on the aluminum oxynitride film, wherein:
the inert gas is a nitrogen gas;
the thermal process temperature of the process of performing the thermal process is 400 degrees C. or more; and
the pressure is 10 atmospheres or more.

* * * * *